US008040684B2

(12) United States Patent
Wang et al.

(10) Patent No.: US 8,040,684 B2
(45) Date of Patent: Oct. 18, 2011

(54) PACKAGE FOR ELECTRONIC COMPONENT AND METHOD FOR MANUFACTURING THE SAME

(75) Inventors: Nan Wang, Shanghai (CN); Shixiong Fan, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 962 days.

(21) Appl. No.: 11/967,806

(22) Filed: Dec. 31, 2007

(65) Prior Publication Data

US 2009/0166249 A1      Jul. 2, 2009

(51) Int. Cl.
*H01R 12/16* (2006.01)
(52) U.S. Cl. ........ 361/790; 361/792; 361/794; 361/816; 361/818
(58) Field of Classification Search .................. 361/752, 361/816–818, 794–795
See application file for complete search history.

(56) References Cited

U.S. PATENT DOCUMENTS

| | | | |
|---|---|---|---|
| 5,363,105 A | 11/1994 | Ono et al. | |
| 5,668,509 A * | 9/1997 | Hoffmeister et al. | 333/33 |
| 5,675,302 A * | 10/1997 | Howard et al. | 333/243 |
| 5,852,391 A | 12/1998 | Watanabe et al. | |
| 6,265,774 B1 | 7/2001 | Sholley et al. | |
| 7,782,624 B2 * | 8/2010 | Fujii | 361/720 |
| 2004/0080917 A1 | 4/2004 | Steddom et al. | |

* cited by examiner

*Primary Examiner* — Tuan T Dinh
(74) *Attorney, Agent, or Firm* — Husch Blackwell

(57) ABSTRACT

A package for providing electromagnetic shielding for microwave circuits. The package includes a top board having an upper surface, a lower surface opposite to the upper surface and a side surface joining the upper surface and the lower surface, and a bottom board having an upper surface attached to the lower surface of the top board, a lower surface opposite to the upper surface and an outer side surface joining the upper surface and the lower surface. The top board further includes at least one ground layer formed therein and a first metal coating formed on at least part of the side surface of the top board. The bottom board includes an inner side surface extending from the upper surface of the bottom board toward the lower surface of the bottom board and an inner lower surface joining the inner side surface, thereby providing an inner space for accommodating the microwave circuit. The bottom board further includes a second metal coating formed on at least part of the outer side surface of the bottom board and a third metal coating formed on at least part of the lower surface of the bottom board. The ground layer, the first metal coating, the second metal coating and the third metal coating are electrically coupled to provide an electric shield for the microwave circuit.

19 Claims, 5 Drawing Sheets

PACKAGE FOR ELECTRONIC COMPONENT AND METHOD FOR MANUFACTURING THE SAME

FIELD OF THE INVENTION

The present invention relates generally to a package for electronic components and a method for manufacturing the package. More particularly, the present invention relates to a package for microwave or millimeter-wave radio equipments, such as microwave circuits and chips, and a method for manufacturing the package.

BACKGROUND

Microwave and millimeter-wave products, such as motion detectors, are commonplace in home and industry applications. Microwave energy has many other types of applications. For instance, microwave energy is used for radar, broadcast radio and television, meteorology, satellite communications, distance measuring, and mobile phones, to name a few.

In the process of manufacturing microwave and millimeter-wave products using planar circuit approaches, the packaging process is critical because it affects the properties of the products, such as the cost of products, the performances of the products, the weight of the products and the applicability of the products.

Traditionally, due to the sensitive characteristics of microwave and millimeter-wave signals, it is necessary to mount the circuit boards into a shielded cavity during packaging the microwave or millimeter-wave circuits, in order to prevent the signals from being interfered by environmental signals or noises, such as signals transmitted from nearby electronic devices, e.g., a cordless telephone utilizing the same or similar frequency band for the transmission of communication information. This step renders the entire structure of the microwave or millimeter-wave module including the circuit boards and the cavity housing the circuit boards complex and, accordingly, increases the costs of manufacturing.

Thus, it would be advantageous to provide a package for providing an electromagnetic shielding for a microwave circuit, which is capable of avoiding interferences with the environment signals and noises within the vicinity of the microwave circuit as well as simplifying the manufacturing procedures, and a method for manufacturing the package.

SUMMARY OF THE INVENTION

Disclosed is a package for providing an electromagnetic shielding for a microwave circuit. The package includes a top board having an upper surface, a lower surface opposite to the upper surface and a side surface joining the upper surface and the lower surface, and a bottom board having an upper surface attached to the lower surface of the top board, a lower surface opposite to the upper surface and an outer side surface joining the upper surface and the lower surface. The top board further includes a ground layer formed therein and a first metal coating formed on the side surface of the top board. The bottom board includes an inner side surface extending from the upper surface of the bottom board toward the lower surface of the bottom board and an inner lower surface joining the inner side surface. The inner side surface and the inner lower surface form a cavity within the bottom board for accommodating the microwave circuit. The bottom board further includes a second metal coating formed on the outer side surface of the bottom board and a third metal coating formed on the lower surface of the bottom board. The ground layer, the first metal coating, the second metal coating and the third metal coating are electrically coupled to provide an electric shield for the microwave circuit.

Disclosed is a method for manufacturing a package for providing an electromagnetic shielding for a microwave circuit. The method includes the steps of: providing a top board having an upper surface, a lower surface opposite to the upper surface and a side surface joining the upper surface and the lower surface; forming a ground layer in a top board; forming a first metal coating on the side surface of the top board, the first metal coating being electrically coupled with the ground layer; providing a bottom board having an upper surface, a lower surface opposite to the upper surface and an outer side surface joining the upper surface and the lower surface; forming a cavity for accommodating the microwave circuit, the cavity extending from the upper surface of bottom board toward the lower surface of the bottom board, thereby providing an inner side surface opposite to the outer side surface of the bottom board and an inner lower surface joining the inner side surface; forming a second metal coating on the outer side surface of the bottom board, the second metal coating being electrically coupled with the first metal coating; forming a third metal coating on the lower surface of the bottom board, the third metal coating being electrically coupled with the second metal coating; and attaching the lower surface of the top board to the upper surface of the bottom board.

BRIEF DESCRIPTION OF THE DRAWINGS

These and other features, benefits, and advantages of the present invention will become apparent by reference to the following text and figures, with like reference numbers referring to like structures across the view, wherein.

DETAILED DESCRIPTION OF THE INVENTION

The present invention now will be described in detail hereinafter with reference to the accompanying drawings, in which exemplary embodiments of the invention are shown. However, this invention may be embodied in many different forms and should not be construed as limited to the embodiments set forth herein. Like numerals refer to like elements throughout. Specifically, a package for providing an electromagnetic shielding for a microwave circuit according to one exemplary embodiment of the present invention will be described in connection with a microwave product, such as a microwave oven or a microwave communication terminal. However, it should be recognized that the package is applicable to any suitable circumstances where an electromagnetic shielding is required.

The basic configuration of a package for providing an electromagnetic shielding for a microwave circuit according to one exemplary embodiment of the present invention will be described in reference with FIGS. 1-3.

Figure 1:
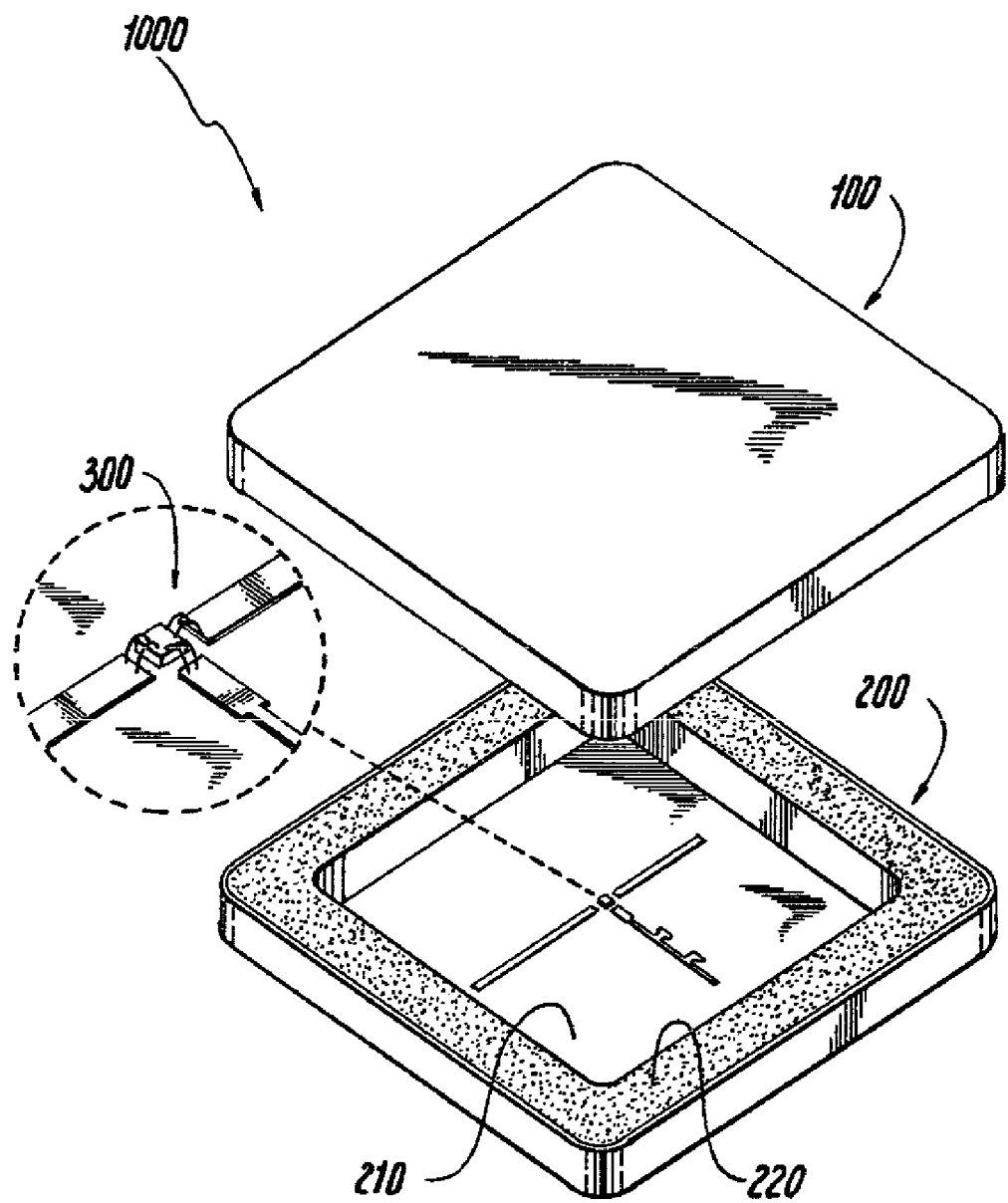
FIG. 1 is an exploded perspective view of a package for providing an electromagnetic shielding for a microwave circuit according to one exemplary embodiment of the present invention.

FIG. 1 is an exploded perspective view of a package for providing an electromagnetic shielding for a microwave circuit according to one exemplary embodiment of the present invention. Generally, the package 1000 includes a top board 100, a bottom board 200 attached to the top board and a microwave circuit 300 disposed in a cavity 210 (described later in connection with FIG. 3) formed in the bottom board 200. FIG. 2 is an exploded perspective view of the top board 100 and the bottom board 200 of the package 1000 before the cavity is formed with in the bottom board. Generally, the outer profiles of the top board 100 and the bottom board 200 are complementary with each other, thereby providing a compact, unitary and continuous module after attached with each other FIG. 3 is a sectional view of the package illustrated in FIG. 1.

Figure 2:
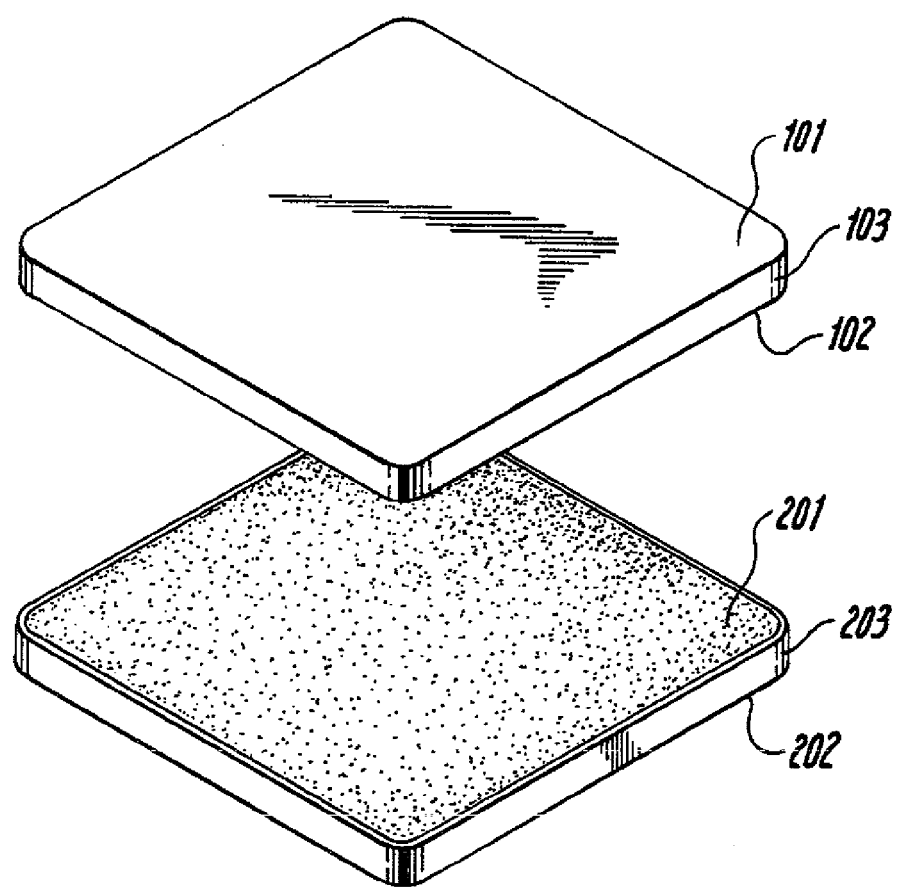
FIG. 2 is an exploded perspective view of a top board and a bottom board of the package for providing an electromagnetic shielding for a microwave circuit according to one exemplary embodiment of the present invention, as illustrated in FIG. 1.

As illustrated in FIG. 2, the top board 100 includes an upper surface 101, a lower surface 102 opposite to the upper surface 101, and a side surface 103 connecting the upper surface 101 and the lower surface 102. The bottom board 200 includes an upper surface 201 upon which the top board 100 is mounted, a lower surface 202 opposite to the upper surface 201, and an outer side surface 203 connecting the upper surface 201 and the lower surface 202. In one embodiment, the side surface 103 of the top board 100 and the outer side surface 203 of the bottom board 200 are flush with each other, to provide a unitary and continuous outer profile of the package. The top board 100 can be mounted on the bottom board 200 directly or with one or more intervening layers disposed therebetween. The top board 100 or the bottom board 200 can have any suitable shapes and profiles, such as blocks or cylinders.

The cavity 210 is formed within the bottom board for accommodating all necessary electrical and/or electronic components of a microwave product, including the circuit 300. The cavity 210 can be formed by any suitable known process and measure in the art, such as etching and soldering. As shown in FIG. 3, the cavity 210 is formed to extend from the upper surface 201 toward the lower surface 202 of the bottom board 200. Accordingly, the bottom board 200 is formed with an inner side surface 204 and an inner lower surface 205, defining the shapes and configurations of the cavity 210. Accordingly, a frame 220 surrounding the electrical components is formed.

The cavity 210 can assume any suitable shape and profile, depending on the requirements of the specific applications of the package. For example, as shown in FIG. 1, the cavity 210 is a square inner space formed within the bottom board 200, with the inner side surface 204 being parallel with the outer side surface 203 and the inner lower surface 205 being parallel with the outer lower surface 202. In such a condition, the volume of the cavity 210 can be defined by geometric parameters H and W shown in FIG. 1, wherein H is the height of the cavity 201 extending from the upper surface 201 to the inner lower surface 205 and W is the thickness of the frame 220 surrounding the cavity 210. With the above-described configuration, it is ensured that the electrical components of a microwave product, such as a microwave circuit, is enclosed and protected by the package formed by the top board 100 and the bottom board 200.

Figure 3:
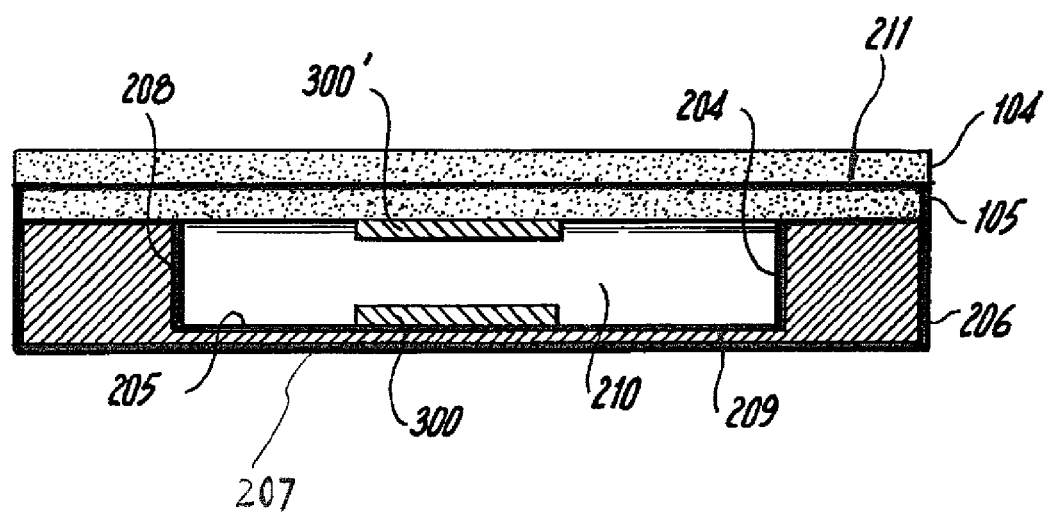
FIG. 3 is a sectional view of the package for providing an electromagnetic shielding for a microwave circuit according to one exemplary embodiment of the present invention, as illustrated in FIG. 1.

Furthermore, as shown in FIG. 3, in order to provide an electromagnetic shielding for the microwave circuit 300, the top board 100 is further provided with a ground layer 104 formed within the top board 100 and a first metal coating 105 formed on the side surface 103 of the top board 100, and the bottom board 200 is further provided with a second metal coating 206 formed on the outer side surface 203 of the bottom board 200 and third coating 207 formed on the lower surface 202 of the bottom board 200. The ground layer 104, the first metal coating 105, the second metal coating 206 and the third metal coating 207 are electrically coupled together to provide an electromagnetic shielding for the microwave circuit 300 disposed within cavity 210.

The ground layer 104, first metal coating 105, the second metal coating 206 and the third metal coating 207 can have any suitable shape or profile to fulfill the functionality of electromagnetic shielding, as long as they are electrically coupled together to provide an electromagnetic shielding for the microwave circuit. For example, the ground layer 104 is formed as a separate layer embedded within the top board 100 and extending throughout the area of the top board 100. For example, the second metal coating 206 is formed to cover at least part of the area of the outer side surface 203 extending from the upper surface 201 toward the lower surface 202. For example, the first metal coating 105 is formed on part of the side surface 103 of the top board 100 to physically connect both the ground layer 104 and the second metal coating 206 and the third metal coating 207 is formed throughout the lower surface 202 of the bottom board 200 to physically connect the second metal coating 206, thereby providing a continuous electromagnetic shielding for the circuit.

Furthermore, the ground layer 104 can be formed at any suitable locations relative to the top board 100. FIG. 3 illustrates an example, wherein the ground layer 104 is embedded within the top board 100 or sandwiched between two separate layers forming the top board 100. The location of the ground layer 104 is not limited to what is shown. For example, the location of the ground layer 104 can float between the upper surface 101 and the lower surface 102, as long as the ground layer 104 is electrically coupled with the first metal coating 105, the second metal coating 206 and the third metal coating 207 to provide an electromagnetic shielding for the circuit. In addition, the ground layer 104 can be formed on the upper surface 101 or the lower surface 102 of the top board 100. If the ground layer 104 is formed on the upper surface 101 of the top board 100, the first metal coating 105 extends from the upper surface 101 to the lower surface 102 of the top board 100 to connect the ground layer 104 with the second metal coating 206. If the ground layer 104 is formed on the lower surface 102 of the top board, the first metal layer 105 can be obviated or formed with very small thickness to ensure the electrical coupling between the ground layer 104 and the second metal coating 206, in which condition the circuit 300 should be formed on the inner lower surface 204 of the bottom board 200.

It should be recognized that the shapes and profiles of the ground layer 104, the first metal coating 105, the second metal coating 206 and the third metal layer 207 are not limited to those described. For example, it is not necessary for all the elements be physically connected, and any intervening layers, terminals, vias are possible to implement the electrical connection therebetween. For example, it is not necessary for the ground layer 104 to extend throughout the entire area of the top board, and instead the layer 104 can be totally embedded within the top board 100, with a plurality of strip-contacts extending to contact the first metal layer 105.

In addition, the materials for forming the top board 100 and the bottom board 200 can be chosen strategically, taking into consideration the manufacturing costs and the expected performance of the microwave product employing the package. For example, full Teflon based materials or other millimeter-wave materials can provide a higher performance but would incur higher costs. Alternatively, a solution of employing mixed materials can be a balance between the performance and the costs. For example, the materials for the bottom board 200 is set to FR4 and the materials for the top board 100 is set to ROGERS 4003™. FR4 is a glass fiber epoxy laminate, the most commonly used PCB material. RO4003™ is a high frequency circuit material provided from ROGRES Corp. However, since a reasonable rigidity of the structure of the package shall be ensured during the manufacturing process, soft microwave materials, such as ROGERS 5880 (RT/duroids880: high frequency circuit Teflon material from ROGRES Corp.) are not recommended.

As shown in FIG. 3, in the condition that the circuit, such as the circuit 300', is formed on the lower surface 102 of the top board 100, an alternative or additional electromagnetic shielding can be provided by a fourth metal coating 208 formed on the inner side surface 204 of the bottom board 200, a fifth metal coating 209 formed on the inner lower surface 205 of the bottom board 200, and a sixth metal coating 211 formed on the upper surface of the frame 220 or on the part of the lower surface 102 of the top board 100 corresponding to the upper surface of the frame 220. The fourth metal coating 208, the fifth metal coating 209 and the sixth metal coating 211 are electrically coupled with the first metal coating 105 and the ground layer 104, thereby forming an electromagnetic shielding having a smaller shielding space for the circuit formed on the lower surface 102 of the top board 100.

The fourth metal coating 208, the fifth metal coating 209 and the sixth metal coating 211 can assume any suitable shape and profile, as long as they are electrically coupled with the first metal coating and the ground layer to provide an electromagnetic shielding. In addition, the above-described configuration implemented by fourth metal coating 208, the fifth metal coating 209 and the sixth metal coating 211, coupled with the first metal coating 105 and the ground layer 104, can be provided alone as a mechanism for implementing an electromagnetic shielding for the microwave circuits or chips, or provided together with any other configuration, such as the one by the ground layer 104, the first metal coating 105, the second metal coating 206 and the third metal coating 207, to provide an enhanced electromagnetic shielding for the microwave circuits or chips. In addition, the sixth metal coating 211 can be replaced by any suitable structure to implement the electrical connection between the ground layer 104 and the fourth metal coating 208, including but not limited to multiple metal-coated vias formed within the top board and extending into the frame 220 of the bottom board 200.

In addition, the above-described configuration of fourth metal coating 208, the fifth metal coating 209 and the sixth metal coating 211, coupled with the first metal coating 105 and the ground layer 104, can provide the advantages of adjusting the Q value of the cavity 210. Generally, a resonant system responds to frequencies close to its natural frequency much more strongly than it responds to other frequencies. A system with a high Q value resonates with a greater amplitude (at the resonant frequency) than one with a low Q value, and its response falls off more rapidly as the frequency moves away from resonance.

Since the dielectric material forming the frame 220 may adversely affect the Q value of the cavity 210, forming a coating on the inner surface of the frame 200 can overcome the effect. Generally, if the materials forming the bottom board have a dielectric with a lower $\epsilon$ (permittivity of the material of propagation), a better Q value may be achieved. However, since such materials are usually expensive, it is cost-effective to select cheap materials, such as an FR4, and further apply an electromagnetic shielding by metal-coating the inner side surface 204 and the inner lower surface 205, such that to adjust the Q value as well as avoid the depravation of microwave performance by the frame 220 of the bottom board 200.

The thickness of the metal coatings of the package is a critical factor for the shielding effect of the package. For example, the thickness of the metal coating can be calculated as a skin depth by the following equation:

$$\Delta = \sqrt{\frac{2}{\omega\mu\sigma}}$$

Where:
 $\omega$=angular frequency of the wave
 $\mu$=permeability of the material
 $\sigma$=electrical conductivity of the material of propagation
Specifically, in the condition where the temperature is room temperature, the coating material is Cu and the microwave has a band of 8 mm (36.5 GHz), the skin depth is: $\Delta=0.066/\sqrt{f}=3.45\times10^{-7}$ m=0.3 um<<9 um(¼ Oz). Generally, for most applications, the thinnest thickness is ¼ Oz, therefore the 0.3 um skin depth is far below this. Thus, in most cases, the thickness is good enough to shield most microwave signals.

Figure 4:
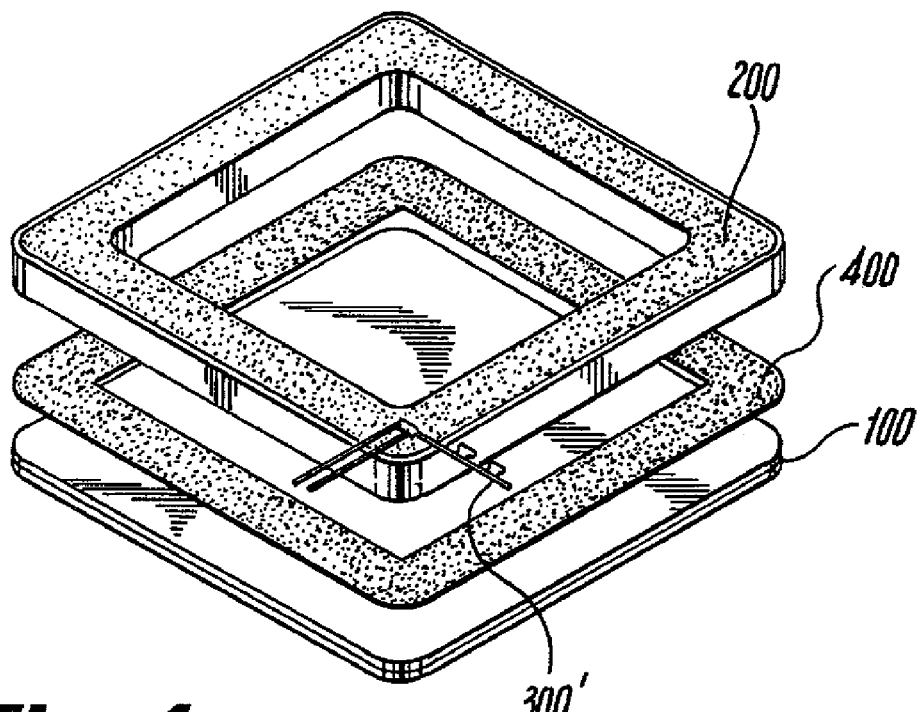
FIG. 4 is an exploded perspective view of a package for providing an electromagnetic shielding for a microwave circuit according to another exemplary embodiment of the present invention, wherein the packing includes a joining layer disposed between the top board and the bottom board of the package.
Figure 5:
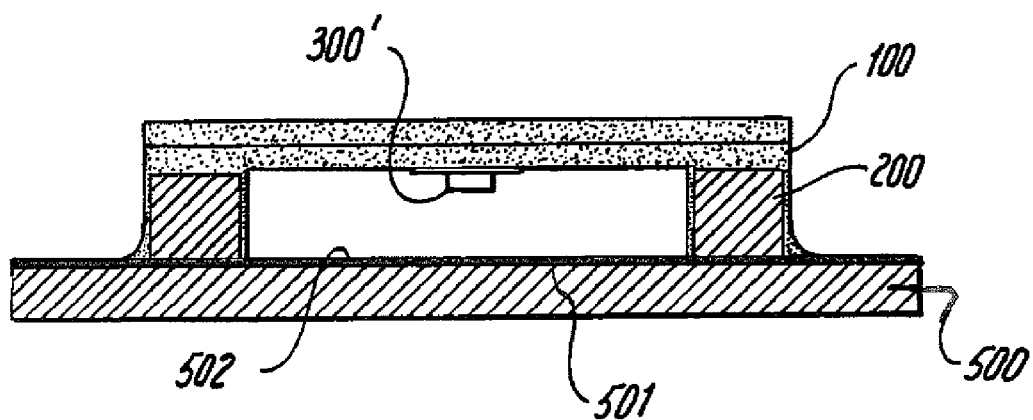
FIG. 5 is a sectional view of a package for providing an electromagnetic shielding for a microwave circuit according to yet another exemplary embodiment of the present invention, wherein the packing includes a base board upon which the bottom board mounted.

FIG. 4 illustrates a package for providing an electromagnetic shielding for a microwave circuit according to another exemplary embodiment of the package. As shown in FIG. 4, a joining layer 400 is provided between the upper surface 201 of the bottom board 200 and the lower surface 102 of the top board 100. The joining layer 400 can be in any suitable form to implement conglutination of the top board 100 and the bottom board 200, thereby providing an integrated module. Furthermore, as shown in FIG. 5, a microwave circuit board 300', similar to and interchangeable with the microwave circuit board 300, is formed on the lower surface 102 of the top board 100, by any suitable known process and measure, such as etching and soldering. In one embodiment, in order to provide a highly integrated structure of the package, both the circuit 300 formed on the inner lower surface 204 and the circuit 300' formed on the lower surface 102 of the top board 100 are provided simultaneously, as shown in FIG. 3.

As shown in FIG. 5, the integrated module, including the top board 100, bottom board 200 and the circuit 300' accommodated within the cavity 210 of the bottom board 200, is mounted onto a base board 500 having an upper surface 501. For example, due to the compact and integrated arrangement of the module, the package can be mounted on the base board 500 as a surface mount (SMT) component, to further simplify the manufacturing process.

Furthermore, as shown in FIG. 5, the cavity 210 of bottom board 200 is formed to extend all the way from the upper surface 201 to the lower surface 202 of the bottom board 200, to communicate with the upper surface 501 of the base board 500. Since the bottom board 200 is formed as a hollow component, the frame 220 acts as a supporting wall extending from the upper surface 201 to the lower surface 202 of the bottom board 200, around the cavity 210. The upper surface 501 of the base board 500 is formed with a seventh metal coating 502, to electrically communicate with the second metal coating 206 and/or the fourth metal coating 208 shown in FIG. 3, thereby providing an electromagnetic shielding for the microwave circuit 300'.

Figure 6:
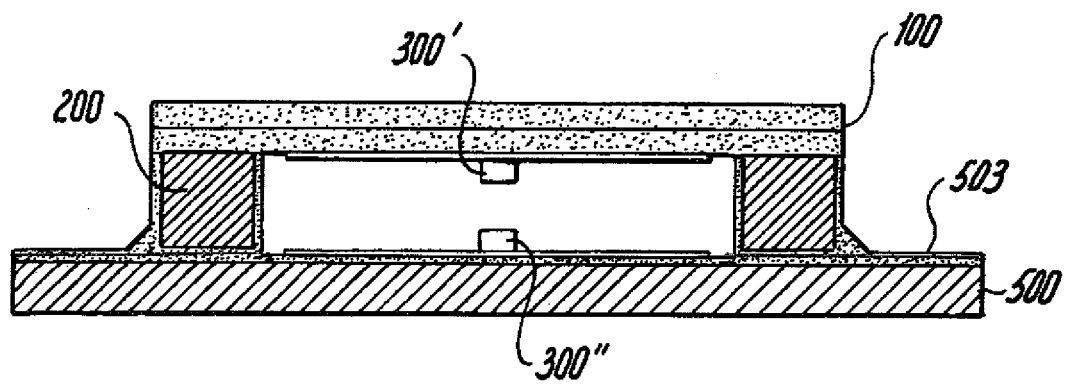
FIG. 6 is a sectional view of a package for providing an electromagnetic shielding for a microwave circuit according to still another exemplary embodiment of the present invention, wherein the packing includes a base board made of a mixed material upon which the bottom board mounted, the bottom board includes an additional inner coating and an additional circuit is mounted on the base board.

FIG. 6 illustrated another exemplary embodiment similar to that of FIG. 5. In this embodiment, a plurality of microwave circuits are formed on both the lower surface 102 of the top board 100 and the upper surface 501 of the base board 500. For example, a microwave circuit 300" is formed on the upper surface 501 of the base board 500, and the microwave circuit 300' is formed on the lower surface 102 of the top board 100. This configuration provides a more integrated and compact package, by having the microwave circuits formed on both the upper side and lower side of the cavity 210. Since the circuit 300" is formed on the upper surface 501 of the base board 500, no metal coating is formed on the upper surface 501 of the base board 500. In order to provide an electromagnetic shielding for the circuits, the base board 500 is formed with a metal layer (or a ground layer) 503 within the board 500. The metal layer 503 can be electrically coupled to the second metal coating 206 and/or fourth metal coating 208 by any suitable process and measure, such as metal-coated vias formed within the base board 500, thereby providing an electromagnetic shielding for the circuits 300' and 300". The metal layer 503 can be formed at any suitable location within the base board 500, between the upper surface 501 and the lower surface of the base board 500, similar to the ground layer 104 formed within the top board 100.

Figure 7:
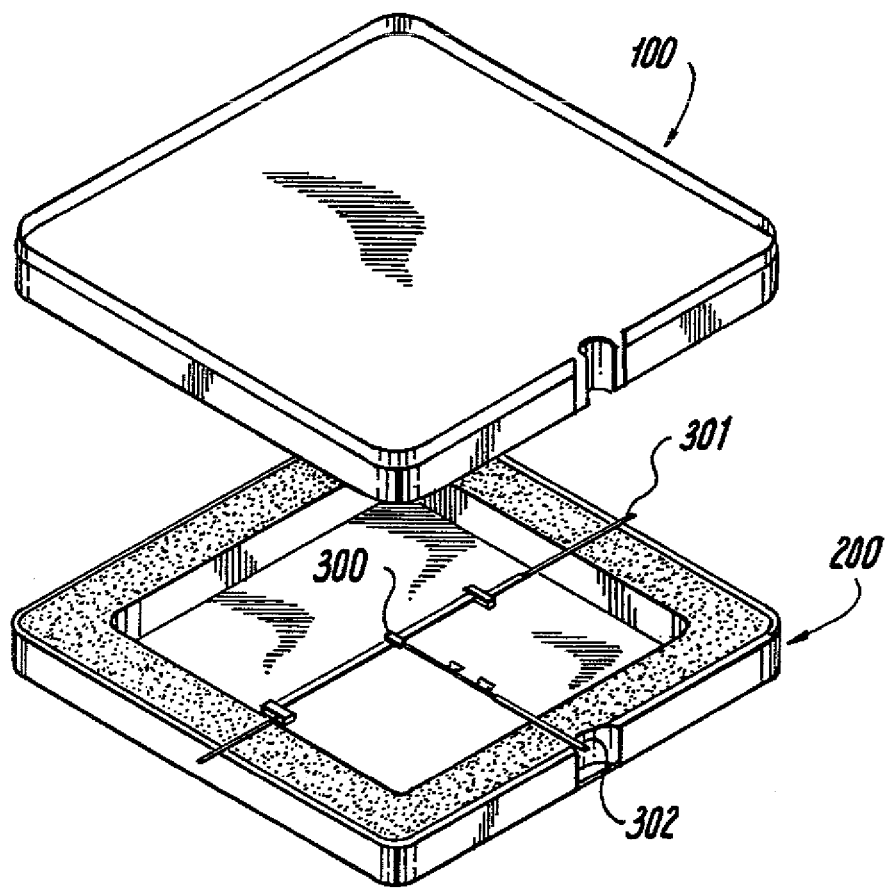
FIG. 7 is an exploded perspective view of a package for providing an electromagnetic shielding for a microwave circuit according to still yet another exemplary embodiment of the present invention, wherein package includes a microwave tunnel and a DC tunnel for the microwave circuit.

FIG. 7 illustrates an example of a microwave tunnel 301 and a DC tunnel 302 in connection with the microwave circuit 300. In the shown example, an Field Effect Transistor (FET) is formed as a component of the microwave circuit 300. The microwave tunnel 301 is coupled with another microwave layer by a gap (not shown) located on the inner GND layer. Through a filter network, the DC signal is connected to the metal coating on the side surfaces of the top board and the bottom board, as an independent pin of the package.

Figure 8:
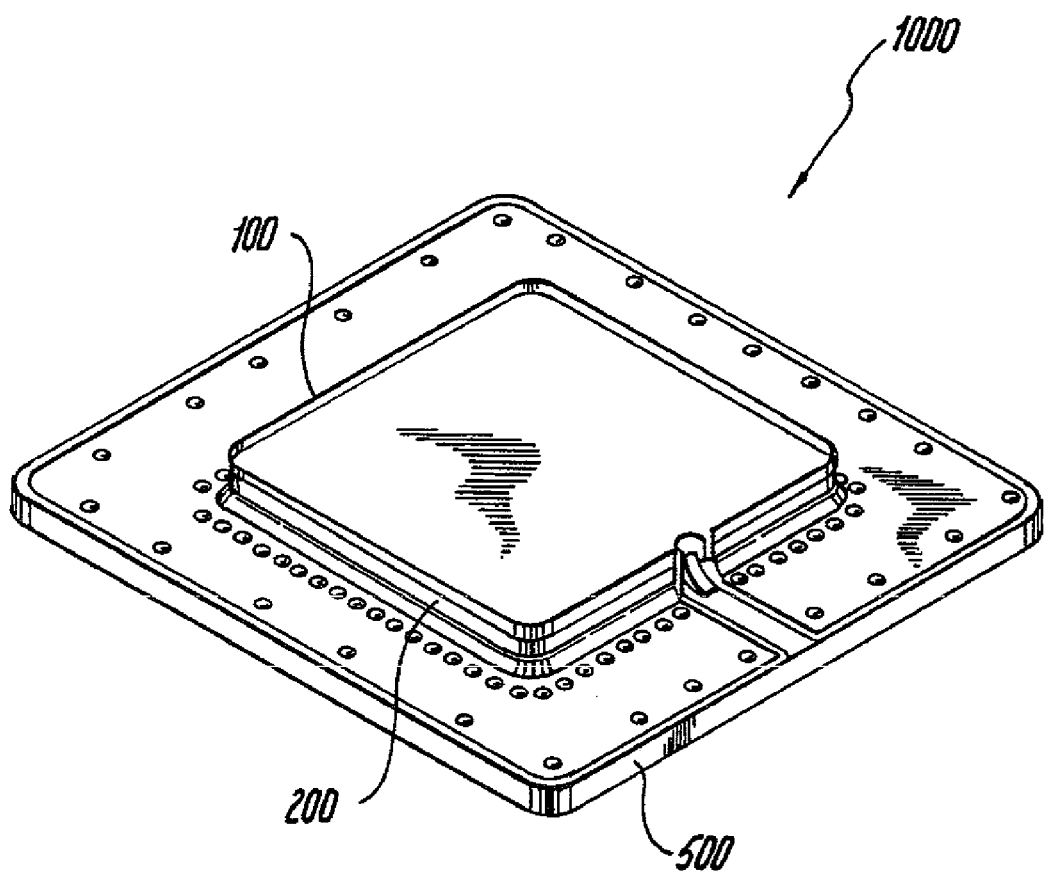
FIG. 8 is a perspective view of a final product of a package for providing an electromagnetic shielding for a microwave circuit according to an exemplary embodiment of the present invention.

FIG. 8 is a perspective view illustrating a completed package wherein the integrated module made of the top board and the bottom board is mounted on the base board as an SMT component, by any suitable standard SMT processes and measures. Further, in order to prevent the electrical and electronic components accommodated within the cavity 210 from falling off, the time and temperature for applying solders shall be controlled.

According to an exemplary embodiment of the present invention, a method for manufacturing a package for providing an electromagnetic shielding for a microwave circuit is also provided. The method includes the steps of: providing a top board having an upper surface, a lower surface opposite to the upper surface and a side surface joining the upper surface and the lower surface; forming a ground layer in a top board; forming a first metal coating on the side surface of the top board, the first metal coating being electrically coupled with the ground layer; providing a bottom board having an upper surface, a lower surface opposite to the upper surface and an outer side surface joining the upper surface and the lower surface; forming a cavity for accommodating the microwave circuit, the cavity extending from the upper surface of bottom board toward the lower surface of the bottom board, thereby providing an inner side surface opposite to the outer side surface of the bottom board and an inner lower surface joining the inner side surface; forming a second metal coating on the outer side surface of the bottom board, the second metal coating being electrically coupled with the first metal coating; forming a third metal coating on the lower surface of the bottom board, the third metal coating being electrically coupled with the second metal coating; and attaching the lower surface of the top board to the upper surface of the bottom board.

Two approaches can be used to implement the above steps: general milling machining and laser milling machining.

When adopting the first approach, the following order of steps shall be followed, since the general milling machining cannot provide a machining precision as the laser milling machining can. Taking the embodiment shown in FIG. 4 as an example, a microwave circuit, such as the circuits 300' shown in the figures, is first formed on the lower surface 102 of the top board 100, by any known process and measure, such as etching. Next, the bottom board 200 is processed to provide a cavity 210. A joining layer, such as the joining layer 400, is formed separately. Subsequently, the bottom board and the top board are laminated together with the joining layer sandwiched therebetween.

When adopting the second approach, since the laser milling machining allows precise milling, the process can take the following steps. Taking the embodiment shown in FIG. 4 as an example, the circuit 300' is first formed on the lower surface 102 of the top board 100. Then, the top board 100 and the bottom board 200 are laminated together with the joining layer sandwiched therebetween. Subsequently, duet to the precise machining characteristics of laser milling machining, the bottom board 200 is processed precisely to form the cavity 210 having expected shape and profile, which in turn exposes the circuit 300' formed on the lower surface 102 of the top board 100.

The invention has been described herein with reference to particular exemplary embodiments. Certain alterations and modifications may be apparent to those skilled in the art, without departing from the scope of the invention. The exemplary embodiments are meant to be illustrative, not limiting of the scope of the invention, which is defined by the appended claims.

What is claimed is:

1. A package for providing an electromagnetic shielding for a microwave circuit, comprising:
    a top board having an upper surface, a lower surface opposite to the upper surface and a side surface joining the upper surface and the lower surface, the top board comprising at least one ground layer formed therein and a first metal coating formed on at least part of the side surface of the top board; and
    a bottom board having an upper surface attached to the lower surface of the top board, a lower surface opposite to the upper surface and an outer side surface joining the upper surface and the lower surface, the bottom board comprising an inner side surface extending from the upper surface of the bottom board toward the lower surface of the bottom board and an inner lower surface joining the inner side surface, thereby providing an inner space for accommodating the microwave circuit, the bottom board further comprising a second metal coating formed on at least part of the outer side surface of the bottom board and a third metal coating formed on at least part of the lower surface of the bottom board, wherein the ground layer, the first metal coating, the second metal coating and the third metal coating are electrically coupled together to provide an electromagnetic shielding for the microwave circuit.

2. The package of claim 1, wherein the microwave circuit is formed on the lower surface of the top board.

3. The package of claim 1, wherein the microwave circuit is formed on the inner upper surface of the bottom board.

4. The package of claim 1, further comprising a joining layer provided between the lower surface of the top board and the upper surface of the bottom board for joining the top board and the bottom board.

5. The package of claim 1, farther comprising a base board having an upper surface, on which the bottom board is mounted.

6. The package of claim 1, wherein the top board and the bottom board are made of Teflon based materials.

7. The package of claim 1, wherein the top board and the bottom board are made of different materials.

8. The package of claim 2, further comprising a fourth metal coating formed on at least part of the inner side surface of bottom board, a fifth metal coating formed on the inner lower surface of the bottom board and a sixth coating formed on the upper surface of the bottom board, wherein the fourth metal coating, the fifth metal coating and the sixth metal coating are electrically coupled with the first metal coating and the ground layer.

9. The package of claim 5, wherein:
the inner side surface of the bottom board extends from the upper surface of the bottom board to the lower surface of the bottom board, thereby the inner space of the bottom board communicates with the upper surface of the base board;
the microwave circuit is formed on the lower surface of the top board; and
the base board comprises a seventh metal coating formed on the upper surface of the base board, electrically coupled with the second metal coating.

10. A method for manufacturing a package for providing an electromagnetic shielding for a microwave circuit, comprising the steps of:
providing a top board having an upper surface, a lower surface opposite to the upper surface and a side surface joining the upper surface and the lower surface;
forming a ground layer in a top board;
forming a first metal coating on at least part of the side surface of the top board, the first metal coating being electrically coupled with the ground layer;
providing a bottom board having an upper surface, a lower surface opposite to the upper surface and an outer side surface joining the upper surface and the lower surface;
forming a cavity for accommodating the microwave circuit, the cavity extending from the upper surface of bottom board toward the lower surface of the bottom board, thereby providing an inner side surface opposite to the outer side surface of the bottom board and an inner lower surface joining the inner side surface;
forming a second metal coating on at least part of the outer side surface of the bottom board, the second metal coating electrically coupled with the first metal coating;
forming a third metal coating on at least part of the lower surface of the bottom board, the third metal coating electrically coupled with the second metal coating; and
attaching the lower surface of the top board to the upper surface of the bottom board.

11. The method of claim 10, further comprising forming the microwave circuit on the lower surface of the top board.

12. The method of claim 10, further comprising forming the microwave circuit on the inner upper surface of the bottom board.

13. The method of claim 10, wherein attaching the lower surface of the top board to the upper surface of the bottom board comprises forming a joining layer between the lower surface of the top board and the upper surface of the bottom board and attaching the lower surface of the top board to the upper surface of the bottom board by the joining layer.

14. The method of claim 10, further comprising:
forming a fourth metal coating on at least part of the inner side surface of bottom board;
forming a fifth metal coating formed on the inner lower surface of the bottom board; and
forming a sixth coating formed on the upper surface of the bottom board,
wherein the fourth metal coating, the fifth metal coating and the sixth metal coating are electrically coupled with the first metal coating.

15. The method of claim 10, further comprising forming a base board having an upper surface, on which the bottom board is mounted.

16. The method of claim 10, wherein providing a top board and providing a bottom board comprises providing a top board and a bottom board made of Teflon based materials.

17. The method of claim 10, wherein providing a top board and providing a bottom board comprises providing a top board and a bottom board made of different materials.

18. The method of claim 15, wherein forming a cavity for accommodating the microwave circuit comprises forming a cavity extending from the upper surface of the bottom board to the lower surface of the bottom board, and the method further comprising forming a seventh metal coating on the upper surface of the base board, electrically coupled with the second metal coating.

19. A package for providing an electromagnetic shielding for a microwave circuit, comprising:
a top board having an upper surface, a lower surface opposite to the upper surface and a side surface joining the upper surface and the lower surface, the top board comprising at least one ground layer formed therein and a first metal coating formed on at least part of the side surface of the top board electrically coupled with the ground layer; and
a bottom board having an upper surface attached to the lower surface of the top board, a lower surface opposite to the upper surface and an outer side surface joining the upper surface and the lower surface, the bottom board comprising an inner side surface extending from the upper surface of the bottom board toward the lower surface of the bottom board and an inner lower surface joining the inner side surface, thereby providing an inner space for accommodating the microwave circuit, the bottom board further comprising a second metal coating formed on at least part of the inner side surface of the bottom board and a third metal coating formed on at least part of the inner lower surface of the bottom board electrically coupled with the second metal coating, wherein the package further comprises a fourth metal coating formed between the upper surface of the bottom board and the lower surface of the top board, the fourth metal coating being electrically coupled with the first metal coating and the second metal coating, thereby the ground layer, the first metal coating, the second metal coating, the third metal coating and the fourth metal coating providing an electromagnetic shielding for the microwave circuit.

* * * * *